(12) United States Patent
Kakutani et al.

(10) Patent No.: US 10,361,166 B2
(45) Date of Patent: Jul. 23, 2019

(54) BONDING DEVICE

(71) Applicant: SHINKAWA LTD., Tokyo (JP)

(72) Inventors: Osamu Kakutani, Tokyo (JP);
Hidehiro Tazawa, Tokyo (JP);
Masahito Tuji, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 342 days.

(21) Appl. No.: 15/255,111

(22) Filed: Sep. 1, 2016

(65) Prior Publication Data

US 2017/0053889 A1    Feb. 23, 2017

Related U.S. Application Data

(63) Continuation of application No. PCT/JP2014/076151, filed on Sep. 30, 2014.

(30) Foreign Application Priority Data

Mar. 4, 2014  (JP) .................................. 2014-041914

(51) Int. Cl.
*H01L 23/00* (2006.01)
(52) U.S. Cl.
CPC ............ *H01L 24/741* (2013.01); *H01L 24/75* (2013.01); *H01L 2224/75651* (2013.01); *H01L 2224/75744* (2013.01); *H01L 2224/75745* (2013.01); *H01L 2224/75804* (2013.01); *H01L 2224/75841* (2013.01)
(58) Field of Classification Search
CPC ............................. H01L 24/741; H01L 24/75
See application file for complete search history.

(56) References Cited

U.S. PATENT DOCUMENTS

2001/0019229 A1    9/2001 Sawai et al.

FOREIGN PATENT DOCUMENTS

JP    2012-114359    *    6/2012    ............ H01L 21/60

OTHER PUBLICATIONS

"Office Action of China Counterpart Application," dated Apr. 4, 2018, with English translation thereof, p. 1-p. 14.
"Office Action of China Counterpart Application," with English translation thereof, dated Nov. 28, 2018, p. 1-p. 14.

* cited by examiner

*Primary Examiner* — Philip C Tucker
*Assistant Examiner* — John Blades
(74) *Attorney, Agent, or Firm* — JCIPRNET

(57) ABSTRACT

Provided is a bonding apparatus including a table (52), a first reaction member (58A) and a second reaction member (58B), which are each provided movably in a Y axis direction with respect to a pedestal (41). The first and second reaction members are each configured to move in a direction opposite to the table in the Y axis direction when the table moves in the Y axis direction. As viewed in an X axis direction, the first and second reaction members are arranged on both sides of the table, respectively, with the table being interposed between the first and second reaction members, so that the centers of gravity of the first and second reaction members are positioned based on the center of gravity of the table. Consequently, the bonding apparatus can suppress an increase in space, and can improve a weight balance on the pedestal.

8 Claims, 8 Drawing Sheets

BONDING DEVICE

CROSS REFERENCE TO RELATED APPLICATIONS

This application is a Continuation of PCT International Application N PCT/JP2014/076151, filed on Sep. 30, 2014, which claims priority under 35 U.S.C § 119(a) to Patent Application No. 2014-041914, filed in Japan on Mar. 4, 2014, all of that are hereby expressly incorporated by reference into the present application.

TECHNICAL FIELD

Some aspects according to the disclosure relates to a bonding apparatus.

BACKGROUND ART

Hitherto, there is known a bonding apparatus including an XY stage, where an X axis linear motor includes a coil unit constructed by three-phase coils as a moving unit and a yoke unit as a stationary unit, the yoke unit is fixed to a base (pedestal) via a yoke unit guide that can move the yoke unit in the same axial direction as the coil unit, a reaction during a travel of the coil unit is configured to be absorbed, the X axis linear motor is arranged at the bottom of a moving table as this type of bonding apparatus (refer to patent document 1, for example).

CITATION LIST

Patent Documents

Patent Document 1: JP 2012-114359 A

The yoke unit moves toward a direction opposite to that of the coil unit in the direction of an X axis, thereby absorbing a reaction of the movement of the moving table by the X axis linear motor, resulting in prevention of a swing of the base (pedestal) in the bonding apparatus according to Patent Document 1.

Incidentally, there is a bonding apparatus where a table that moves in a drive direction, and a reaction member that is used to cancel a reaction caused by the movement of the table are arranged in the drive direction as the conventional bonding apparatus.

However, the bonding apparatus generally has a long stroke that its moving distance in the drive direction is long, and if both the table and the reaction members are arranged in the drive direction as in the conventional bonding apparatus, a space in the drive direction largely increases. Moreover, both the table and the reaction member are arranged in the drive direction, the center of gravity of the table and the center of gravity of the reaction member largely displaced from each other as a result, and a weight balance of a pedestal that supports the table and the reaction member degrades.

SUMMARY OF THE DISCLOSURE

Problem to be Solved by the Disclosure

Some aspects of the disclosure are made in view of the above-described problem, and a bonding apparatus capable of suppressing the increase in the space, and improving the weight balance on the pedestal, is provided.

Means for Solving Problem

A bonding apparatus according to one aspect of the disclosure includes a table that is provided so as to be movable in a first direction with respect to a pedestal, and a first reaction member and a second reaction member that are respectively provided so as to be movable in the first direction with respect to the pedestal, where the first reaction member and the second reaction member are each configured to move in a direction opposite to the table in the first direction when the table moves in the first direction, the first reaction member and the second reaction member are respectively arranged on both sides of a second direction perpendicular to the first direction with the table interposed between the first and second reaction members, and the first reaction member and the second reaction member are arranged such that a center of gravity of the first reaction member and the second reaction member is at a position based on a center of gravity of the table.

In the above-described bonding apparatus, the table, the first reaction member, and the second reaction member can be respectively arranged such that the center of gravity of the table and the center of gravity of the first reaction member and the second reaction member are at positions based on a center of gravity of the pedestal.

In the above-described bonding apparatus, a position of a center of gravity of the first reaction member and the second reaction member can be coincident with a position of the center of gravity of the table in the first direction, the second direction, and a third direction perpendicular to the first direction and the second direction.

The above-described bonding apparatus can further include a first direction driving unit that includes a coil and a magnet, and respectively drives the table, the first reaction member, and the second reaction member in the first direction, where one of the magnet and the coil can be provided on the table, and the other one of the magnet and the coil can be provided on the first reaction member and the second reaction member.

In the above-described bonding apparatus, the table can be provided so as to be movable in the second direction with respect to the pedestal.

In the above-described bonding apparatus, the table can be configured to move over a relatively long distance in the first direction, and to move over a relatively short distance in the second direction.

In the above-described bonding apparatus, the table can be configured to move at a relatively high rate of acceleration in the first direction, and to move at a relatively low rate of acceleration in the second direction.

In the above-described bonding apparatus, a bonding head used for bonding can be provided on the table.

Effects of the Disclosure

According to the disclosure, the first reaction member and the second reaction member are configured to move toward the direction opposite to that of the table in the first direction when the table moves in the first direction. As a result, a momentum applied to the pedestal becomes theoretically zero, and the pedestal can thus be prevented from swinging. Moreover, the first reaction member and the second reaction member are respectively arranged on both sides of the second direction with the table interposed between the first and second reaction members. As a result, the first reaction member and the second reaction member can be arranged in a compact manner without an extension in the first direction.

Thus, an increase in the space for the first reaction member and the second reaction member can be suppressed. Further, the first reaction member and the second reaction member are arranged such that the center of gravity of the first reaction member and the second reaction member is at a position based on a center of gravity of the table. As a result, a displacement between the center of gravity of the table and the center of gravity of the first reaction member and the second reaction member can be decreased in comparison with the conventional bonding apparatus. Thus, the weight balance in the pedestal can be improved, and, for example, an adverse effect such as generation of a moment on the bonding head provided on the table can be decreased.

DETAILED DESCRIPTION OF THE DISCLOSURE

Figure 1:
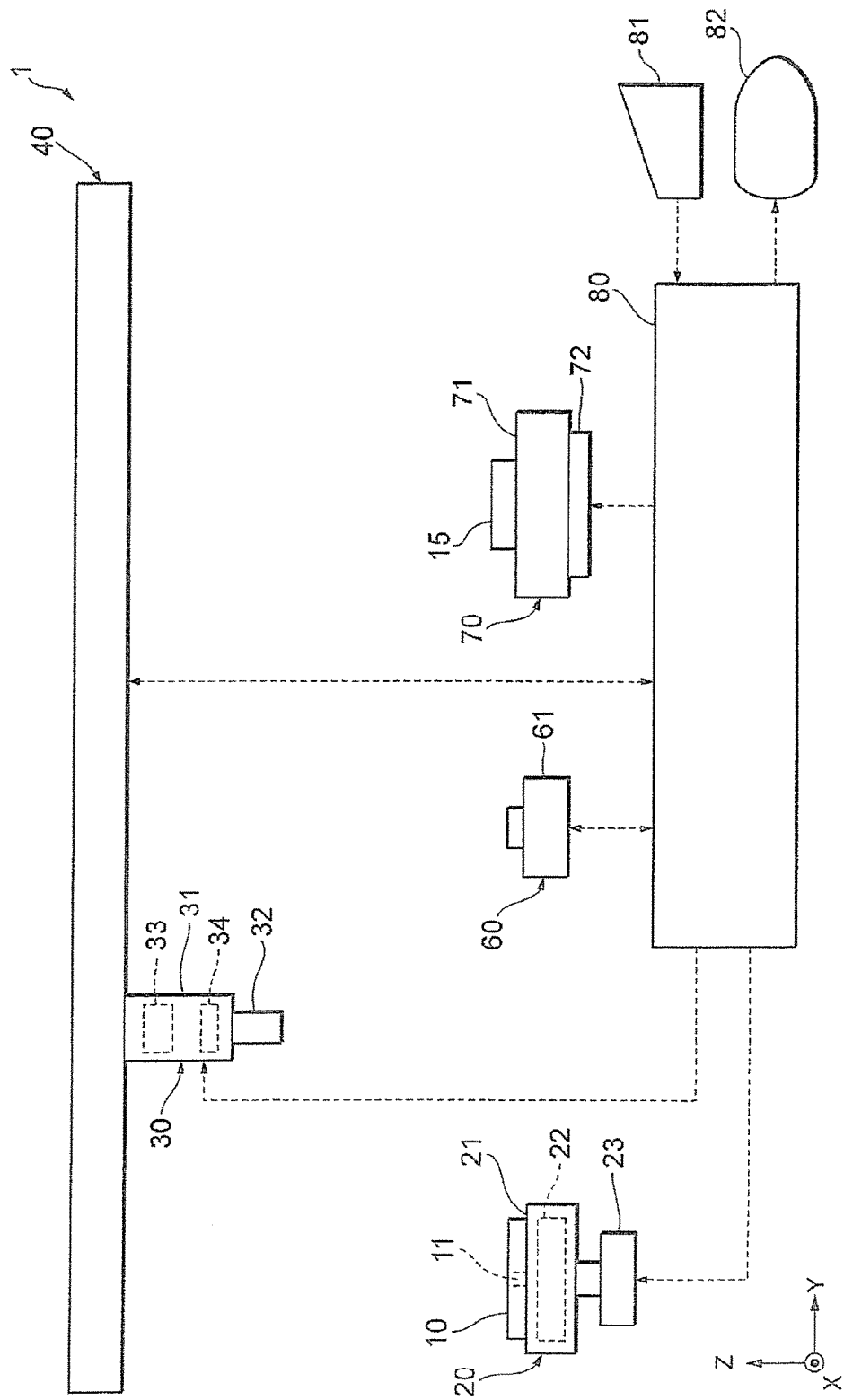
FIG. 1 is a schematic configuration diagram showing an example of a bonding apparatus according to an embodiment.

A description will now be given about an embodiment of the disclosure. Hereinafter in a description of drawings, the same or similar portion is denoted by the same or similar numeral. However, the drawings are schematic. Therefore, specific dimensions and the like need to be determined by referring to a description given below. Moreover, the drawings obviously include portions different in dimensional relationship or ratio among them. Further, a technical scope of the disclosure should not be understood to be limited to the embodiment. It should be noted that a top side of the drawings are referred to as "top"; a bottom side, "bottom", a left side, "left"; and right side "right", and directions along and parallel with an X axis shown in the drawings are referred to as X axis direction; directions along and parallel with a Y axis, Y axis direction; and directions along and parallel with a Z axis, Z axis direction in the following description.

FIG. 1 to FIG. 8 show an embodiment of a bonding apparatus according to the disclosure.

FIG. 1 is a schematic configuration diagram for illustrating an example of the bonding apparatus according to this embodiment.

A bonding apparatus 1 according to this embodiment is a apparatus used to carry out bonding.

The bonding apparatus 1 includes a wafer holder unit 20, a bonding unit 30, an XY drive mechanism 40, a chip recognition unit 60, a substrate transport unit 70, and a control unit 80 as shown in FIG. 1.

The wafer holder unit 20 serves to hold a semiconductor wafer 10. The wafer holder unit 20 is configured to hold the semiconductor wafer 10 divided into multiple semiconductor chips 11 on a wafer stage 21 by using a method such as a vacuum suction.

A push-up unit 22 is provided inside the wafer stage 21. The push-up unit 22 is configured to push up, in a top direction (Z axis direction), one of the multiple semiconductor chips 11 included in the semiconductor wafer 10 so as to form a step with respect to the other semiconductor chips 11. Moreover, a rotational drive mechanism 23 is provided on a bottom portion of the wafer stage 21. The rotational drive mechanism 23 is configured to rotate the wafer stage 21 about the Z axis direction.

The bonding unit 30 serves to pick up the semiconductor chip 11 from the wafer stage 21, and to bond the semiconductor chip 11 to a circuit board 15. The bonding unit 30 includes a bonding head 31.

A bonding tool 32 is attached to the bonding head 31. Moreover, a Z drive mechanism 33 configured to be able to move the bonding tool 32 in the Z axis direction and a rotational drive mechanism 34 configured to be able to rotate the bonding tool 32 about the Z axis direction are provided inside the bonding head 31.

The bonding tool 32 is configured to pick up the semiconductor chip 11. When the semiconductor chip 11 is to be picked up, the XY drive mechanism 40 moves the bonding head 31 above the wafer stage 21 on which the semiconductor chip 11 is placed. The Z drive mechanism 33 moves down the bonding tool 32 so as to be close to a position at a predetermined distance from the semiconductor chip 11 as a subject to be picked up.

The bonding tool 32 can be configured to include vacuum holes for suction, for example. In the case of this example, the vacuum holes can use the vacuum to suck the semiconductor chip 11, thereby picking up the semiconductor chip 11.

Moreover, the bonding tool 32 is configured to bond the semiconductor chip 11. A detailed description will be given later on this point.

The XY drive mechanism 40 serves to drive the bonding unit 30 in the X direction and the Y direction. The XY drive mechanism 40 is configured to move the bonding unit 30 to a predetermined XY position based on a control signal from the control unit 80.

The chip recognition unit 60 serves to recognize the semiconductor chip 11. The chip recognition unit 60 includes a chip camera 61.

The chip camera 61 is configured to be able to take a picture of a rear surface of the semiconductor chip 11. The chip camera 61 is arranged between the wafer holder unit 20 and the substrate transport unit 70, for example, and is configured to take a picture of the rear surface of the semiconductor chip 11 picked up by the bonding tool 32 from a bottom direction (Z axis direction).

The substrate transport unit 70 serves to transport the circuit board 15. The substrate transport unit 70 includes a board stage 71 and transport rails 72.

The circuit board 15 is supplied to the board stage 71 by board supply means (not shown). The board stage 71 is configured to use, for example, the vacuum to suck the circuit board 15, thereby fixing and holding the circuit board 15.

The transport rails 72 are configured to move the board stage 71 in a predetermined direction such as the X axis direction.

When the semiconductor chip 11 is to be bonded to the circuit board 15, the transport rails 72 move the board stage 71 to a position at which the bonding tool 32 can carry out the bonding. The XY drive mechanism 40 moves the bonding head 31 above the board stage 71 on which the circuit board 15 is placed. The Z drive mechanism 33 moves down the bonding tool 32. If the bonding tool 32 includes the vacuum holes, the Z drive mechanism 33 presses the semiconductor chip 11 sucked by the vacuum holes to the circuit board 15 at a predetermined load, thereby being able to bond the semiconductor chip 11 to the circuit board 15.

Although an example of the so-called die bonding for bonding the semiconductor chip 11 to the circuit board 15 is described according to this embodiment, the disclosure is not limited to this example, and can be applied to the so-called flip chip mounting that is to connect a flip chip to bumps arranged in an array form on a circuit board.

The control unit 80 is connected to the wafer holder unit 20, the bonding unit 30, the XY drive mechanism 40, the chip recognition unit 60, and the substrate transport unit 70, and there is provided such a configuration that the control unit 80 controls operations of these components, thereby being able to carry out processing required for the boding. The control unit 80 includes an interface (not shown) that transmits/receives signals to/from the respective components such as the wafer holder unit 20, the bonding unit 30, the XY drive mechanism 40, the chip recognition unit 60, and the substrate transport unit 70, for example. The control unit 80 is configured to carry out feedback for the processing for the bonding based on detection results of cameras, sensors or the like. For example, the control unit 80 recognizes the rear surface of the semiconductor chip 11 based on the image taken by the chip camera 61, detects the position thereof, and controls the XY drive mechanism 40, the Z drive mechanism 33, and the rotational drive mechanism 34 based on the detection result, thereby carrying out control relating to the operation of the bonding such as rear surface recognition processing for correcting the position, the attitude, and the like of the semiconductor chip 11.

Moreover, the control unit 80 is connected to an operation unit 81 for inputting control information and a display unit 82 for outputting the control information, and this configuration allows an operator to use the operation unit 81 to input the required control information while using the display unit 82 to recognize a screen. The control unit 80 can be configured by a computer apparatus including a CPU, a memory and the like, for example, and programs, data and the like for carrying out the processing required for the bonding are stored in advance in the memory.

A description is now given about a configuration of the XY drive mechanism 40.

Figure 2:
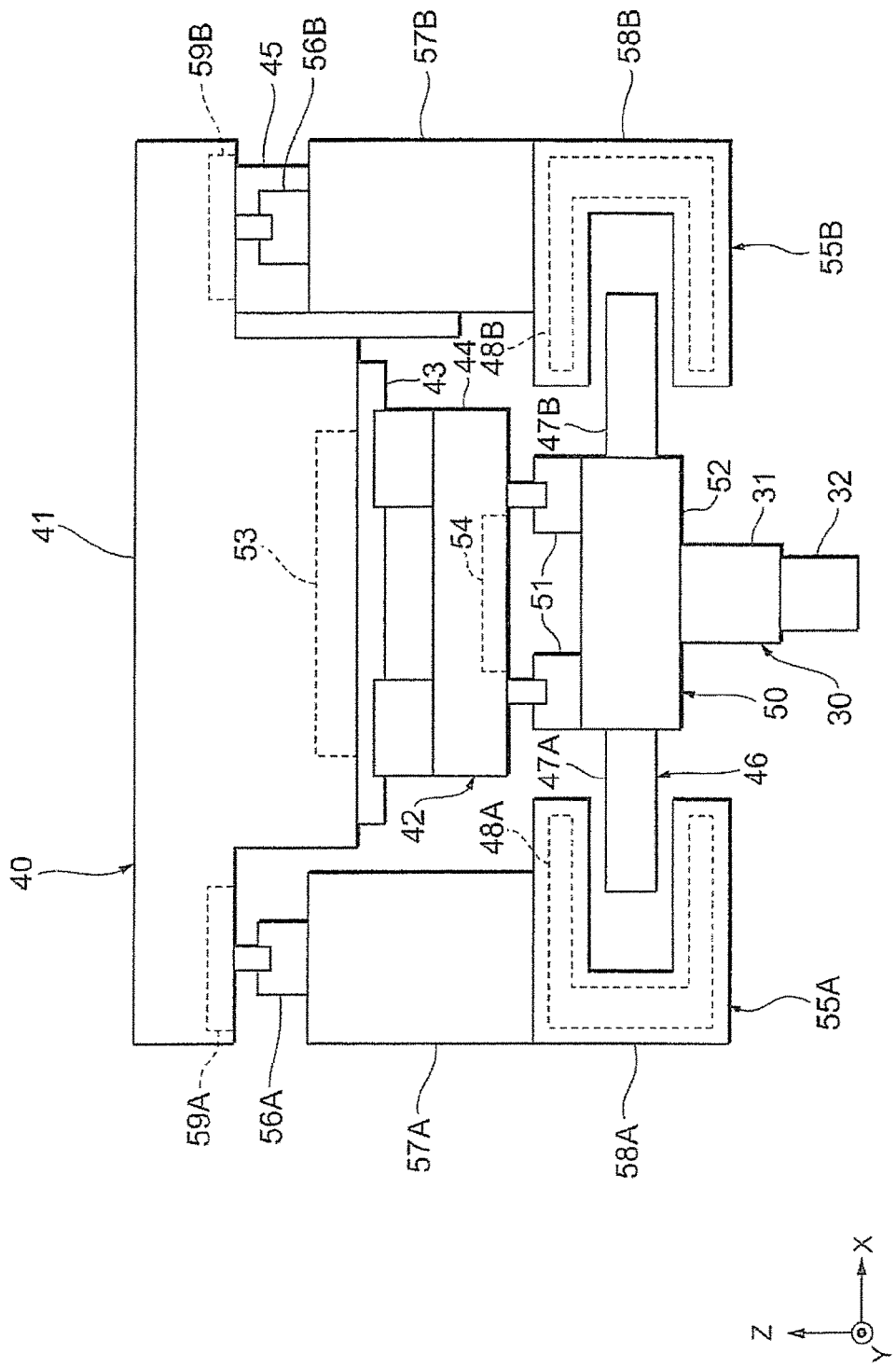
FIG. 2 is a front view showing an example of an XY drive mechanism.
Figure 3:
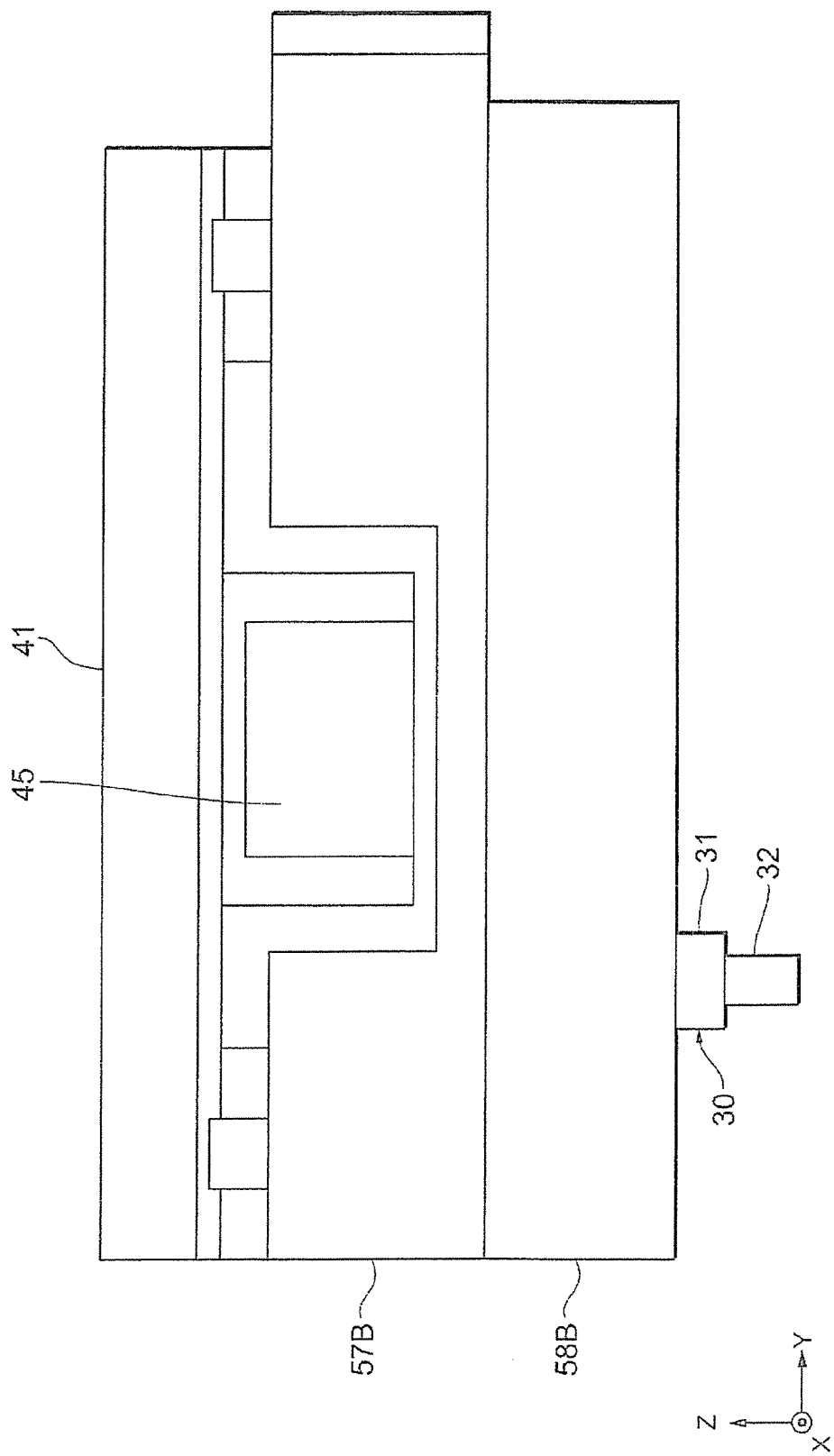
FIG. 3 is a side view showing the example of the XY drive mechanism.
Figure 4:
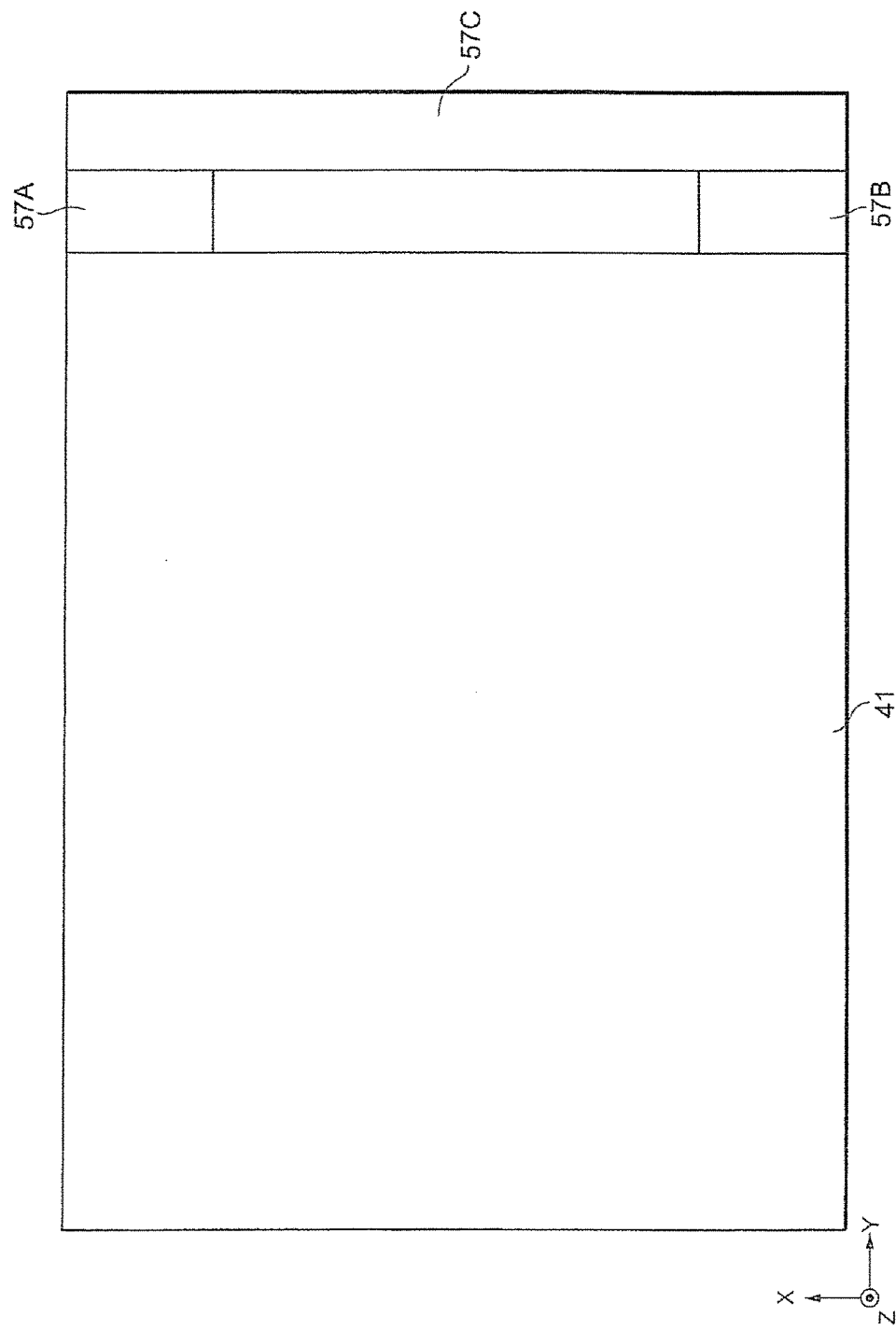
FIG. 4 is a top view showing the example of the XY drive mechanism.
Figure 5:
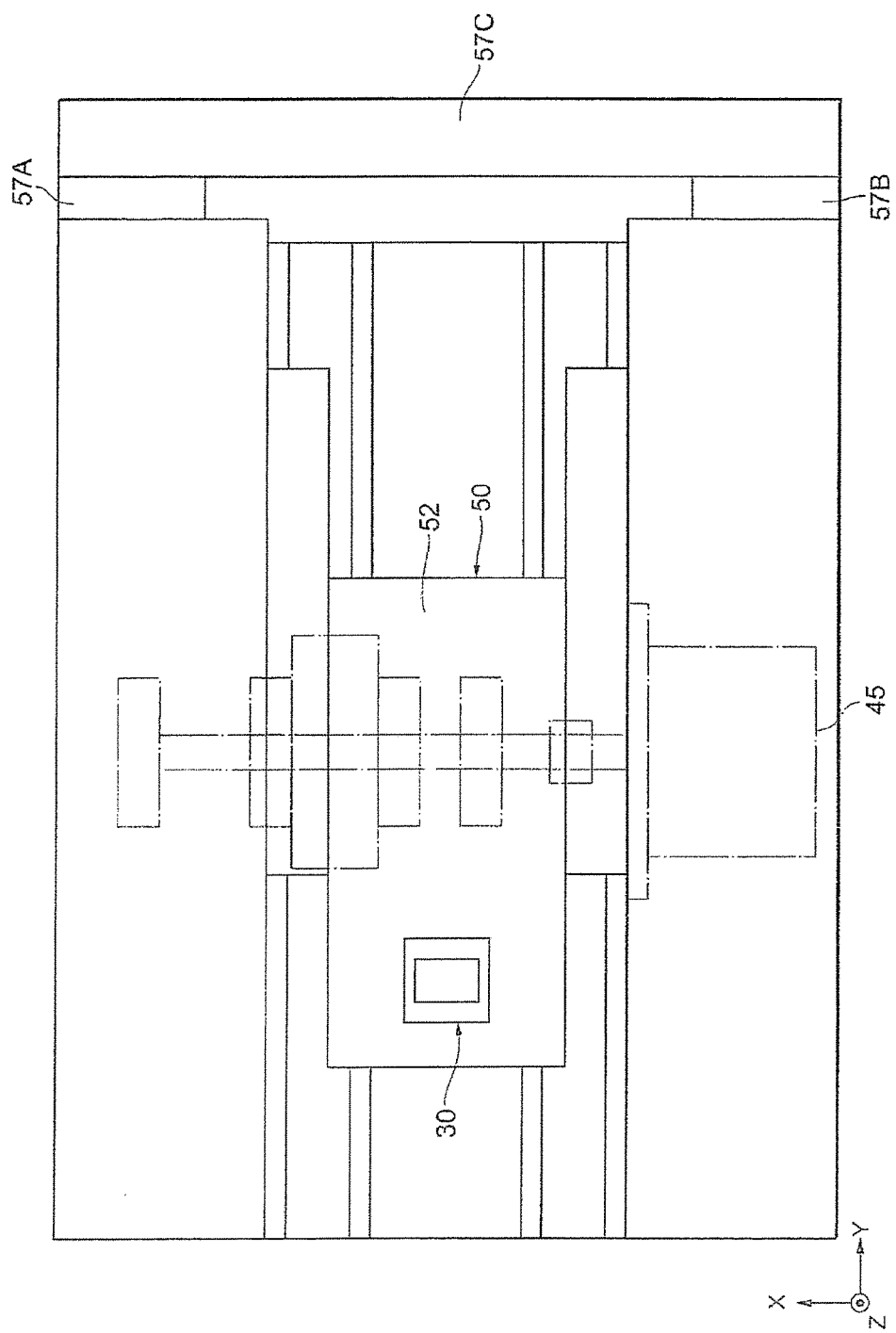
FIG. 5 is a bottom view showing the example of the XY drive mechanism.

FIG. 2 to FIG. 5 are used to illustrate the XY drive mechanism, FIG. 2 is a front view showing an example of the XY drive mechanism, FIG. 3 is a side view showing the example of the XY drive mechanism, FIG. 4 is a top view showing the example of the XY drive mechanism, and FIG. 5 is a bottom view showing the example of the XY drive mechanism. The XY drive mechanism 40 includes a pedestal 41, an X drive unit 42, a table unit 50, a first reaction unit 55A, a second reaction unit 55B, and a Y drive unit 46 as shown in FIG. 2 to FIG. 5.

The pedestal 41 serves to support the respective components such as the X drive unit 42, the table unit 50, the first reaction unit 55A, the second reaction unit 55B, and the Y drive unit 46, for example. The pedestal 41 has a rectangular shape in the plan view as shown in FIG. 4, for example.

The X drive unit 42 serves to drive the table unit 50 in the X axis direction. The X drive unit 42 is provided at the center or approximately at the center of the pedestal 41 in the Y axis direction as shown in FIG. 2, and is provided at the center or approximately at the center of the pedestal 41 in the Y axis direction as shown in FIG. 3, for example. The X drive unit 42 includes an X guide member 43, a hold pedestal 44, and an X drive source 45.

The X guide member 43 serves to guide the hold pedestal 44 in the X axis direction, and is provided on a bottom surface of the pedestal 41. The X guide member 43 can be configured so as to include rails and carriages, for example. In the case of this example, two of the rails, for example, extend in parallel in the X axis direction, and are fixed to the bottom surface of the pedestal 41. Two of the carriages, for example, engage with each of the two rails so as to be movable along the rails, and these four carriages are fixed to the top surface of the hold pedestal 44, thereby enabling guide of the hold pedestal 44 in the X axis direction.

The hold pedestal 44 serves to hold the table unit 50, and the table unit 50 is provided on a bottom surface of the hold pedestal 44.

The X drive source 45 serves to provide a driving force in the X axis direction. The X drive source 45 is configured to provide the driving force based on a control signal from the control unit 80 to the hold pedestal 44. The X drive source 45 can be configured so as to include a rotational type servomotor and a ball screw as shown as long dashed short dashed lines in FIG. 5, for example. In the case of this example, the ball screw converts a driving force by a rotational motion generated by the rotational type servomotor to a translational motion, and transmits the translational motion to the hold pedestal 44, thereby enabling application of the driving force in the X axis direction to the hold pedestal 44.

The table unit 50 serves to support the boding unit 30. The table unit 50, as the X drive unit 42, is provided at the center or approximately at the center of the pedestal 41 in the Y axis direction as shown in FIG. 2, and is provided at the center or approximately at the center of the pedestal 41 in the Y axis direction as shown in FIG. 5, for example. The table unit 50 includes a Y guide member 51, a table 52, a table X sensor 53, and a table Y sensor 54.

The Y guide member 51 serves to guide the table 52 in the Y axis direction, and is provided on the bottom surface of the hold pedestal 44. The guide member 51 can be configured so as to include rails and carriages, for example. In the case of this example, two of the rails, for example, extend in parallel in the Y axis direction, and are fixed to the bottom surface of the hold pedestal 44. Two of the carriages, for example, engage with each of the two rails so as to be movable along the rails, and these four carriages are fixed to a top surface of the table 52, thereby enabling guide of the table 52 in the Y axis direction.

The table 52 serves to hold the bonding unit 30, and the bonding head 31 of the bonding unit 30 is provided on a bottom surface of the table 52. The table 52 is provided so as to be movable in the Y axis direction with respect to the pedestal 41.

Moreover, the table 52 is fixed to the bottom surface of the hold pedestal 44 via the Y guide member 51, and can move together with the hold pedestal 44 in the X axis direction. The table 52 is provided so as to be movable also in the X axis direction with respect to the pedestal 41 in this way.

The table X sensor 53 serves to detect a physical amount in the X direction of the table 52. The table X sensor 53 is provided at a position corresponding to the hold pedestal 44 on the bottom surface of the pedestal 41 as shown in FIG. 2, for example, and is configured to detect the position and the speed in the X axis direction of the table 52 moving together with the hold pedestal 44.

The table Y sensor 54 serves to detect a physical amount in the Y direction of the table 52. The table Y sensor 54 is provided at a position corresponding to the table 52 on the bottom surface of the hold pedestal 44 as shown in FIG. 2, for example, and is configured to detect the position and the speed in the Y axis direction of the table 52.

The first reaction unit 55A is provided, as shown in FIG. 2, on one side (left side hi FIG. 2) in the X axis direction with respect to the table unit 50, for example, and the second reaction unit 55B is provided on the other side (right side in FIG. 2) in the X axis direction with respect to the table unit 50, for example. Moreover, the first reaction unit 55A and the second reaction unit 55B are arranged left-right symmetrical or approximately left-right symmetrical about the table unit 50, particularly about the table 52. The first reaction unit 55A includes a weight guide member 56A, a weight member 57A, a first reaction member 58A, and a reaction member sensor 59A. Similarly, the second reaction unit 55B includes a weight guide member 56B, a weight member 57B, a second reaction member 58B, and a reaction member sensor 59B.

It should be noted that the configuration of the second reaction unit 55B is the same as the configuration of the first reaction unit 55A, a description is hereinafter given about the configuration of the first reaction unit 55A, and a description of the configuration of the second reaction unit 55B is thus appropriately omitted.

The weight guide member 56A serves to guide the weight member 57A in the Y axis direction, and is provided on one surface (bottom surface) of the pedestal 41. The weight guide member 56A can be configured so as to include a rail, carriages and the like, for example. In the case of this example, the rail extends in a straight line form in the Y axis direction, and is fixed to the bottom surface of the pedestal 41. Two of the carriages, for example, engage with the rail so as to be movable along the rail, and these two carriages are fixed to a top surface of the weight member 57A, thereby enabling guide of the weight member 57A in the Y axis direction.

The weight member 57A serves to increase the weight of the first reaction member 58A, and the first reaction member 58A is fixed to a bottom surface of the weight member 57A. A cutout portion is partially formed for the X drive source 45 in the weight member 57B of the second reaction unit 55B as shown in FIG. 3. The weight member 57A and the weight member 57B extend longer than the pedestal 41 in the Y axis direction as shown in FIG. 3 and FIG. 4.

Moreover, the weight member 57A of the first reaction unit 55A and the weight member 57B of the second reaction unit 55B are coupled to each other via a coupling member 57C as shown in FIG. 4 and FIG. 5. As a result, the weight member 57A, the first reaction member 58A, the weight member 57B, and the second reaction member 58B can integrally move.

The first reaction member 58A serves to cancel (absorb) a reaction (reaction force) in the Y axis direction. The table 52 is provided so as to be movable in the Y axis direction with respect to the pedestal 41. Moreover, the first reaction member 58A and the second reaction member 58B are respectively arranged on both sides (the left side and the right side in FIG. 2), with the table 52 interposed between, of the X axis direction as shown in FIG. 2. The reaction member which has conventionally been provided as a single member is divided into the two reaction members as described above, and the reaction members are respectively arranged on the both sides of the X axis direction, with the table 52 interposed between, thereby enabling a compact arrangement of the first reaction member 58A and the second reaction member 58B without an extension in the Y axis direction.

Moreover, the first reaction member 58A is a member extending in the Y axis direction. The first reaction member 58A includes a recess recessed in the X axis direction through a surface opposing a side surface (left side surface in FIG. 2) of the table 52 as shown in FIG. 2, the recess also extends in the Y axis direction, and its front end on a side closer relative to the page and its rear end on a side farther relative to the page in FIG. 2 are open.

The reaction member sensor 59A serves to detect a physical amount in the Y direction of the first reaction member 58A. The reaction member sensor 59A is provided at a position corresponding to the weight member 57A on the bottom surface of the pedestal 41 as shown in FIG. 2, for example, and is configured to detect the speed in the Y axis direction of the first reaction member 58A moving together with the weight member 57A.

Although a description is given about an example that the first reaction unit 55A includes the reaction member sensor 59A, and the second reaction unit 55B includes the reaction member sensor 59B according to this embodiment, the configuration is not limited to this example. As described above, the coupling member 57C enables the integral movement of the weight member 57A, the first reaction member 58A, the weight member 57B, and the second reaction member 58B, and, for example, only either one of the first reaction unit 55A and the second reaction unit 55B can thus be provided with the reaction member sensor. In this case, the reaction member sensor detects the physical amount in the Y direction of the first reaction member 58A and the second reaction member 58B, which integrally move.

The Y drive unit 46 serves to respectively drive the table 52, the first reaction member 58A, and the second reaction member 58B in the Y axis direction. The Y drive unit 46 is, for example, a widely-known linear motor, and includes a coil 47A, a coil 47B, a magnet 48A, and a magnet 48B.

The coil 47A and the coil 47B are respectively provided on the both side surfaces of the table 52 so as to protrude in the X axis direction as shown in FIG. 2. In contrast, the magnet 48A and the magnet 48B are respectively provided inside the first reaction member 58A and the second reaction member 58B. As a result, the Y drive unit 46 that respectively drives the table 52, the first reaction member 58A, and the second reaction member 58B in the Y axis direction can easily be realized (constructed).

Moreover, the coil 47A and the coil 47B are arranged so as to respectively be inserted into the recesses of the first reaction member 58A and the second reaction member 58B with clearances in the X axis direction and the Z axis direction. The recesses of the first reaction member 58A and the second reaction member 58B extend in the Y axis direction, and the coil 47A and the coil 47B can move in the Y axis direction together with the table 52.

Although a description is given about an example that the coil 47A and the coil 47B are provided on the table 52, and the magnet 48A and the magnet 48B are respectively provided inside the first reaction member 58A and the second reaction member 58B according to this embodiment, the configuration is not limited to this example. For example, the coil 47A and the coil 47B can be respectively provided on the first reaction member 58A and the second reaction member 58B, and the magnet 48A and the magnet 48B can be provided on the table 52.

The control unit 80 controls voltages supplied to the coil 47A and the coil 47B of the Y drive unit 46 based on a signal from the table Y sensor 54 and a signal from the reaction member sensor 59A when the table 52 moves in the Y axis direction in the XY drive mechanism 40. On this occasion, the first reaction member 58A and the second reaction member 58B move toward a direction opposite to that of the table 52 in the Y axis direction, and the movements of the first reaction member 58A and the second reaction member 58B cancel (compensate for) the reaction (reaction force) of the table 52. As a result, a momentum applied to the pedestal 41 is theoretically zero when the table 52 moves in the Y axis direction, and a swing of the pedestal 41 is thus not generated.

Moreover, the control unit 80 controls a voltage supplied to the X drive source 45 of the X drive unit 42 based on a signal from the table X sensor 53 when the table 52 moves in the X axis direction in the XY drive mechanism 40. A counterweight that moves toward a direction opposite to that of the table 52 does not exist in the X axis direction in this way. Therefore, although a force is applied to the pedestal 41 as the table 52 moves in the X axis direction, the movement in the X axis direction is minute, and the acceleration thereof is very low. As a result, the force applied to the pedestal 41 caused by the movement of the table 52 in the X axis direction is very small, and a swing of the pedestal 41 hardly occurs.

A description is now given about a state of an operation of the table 52.

Figure 6:
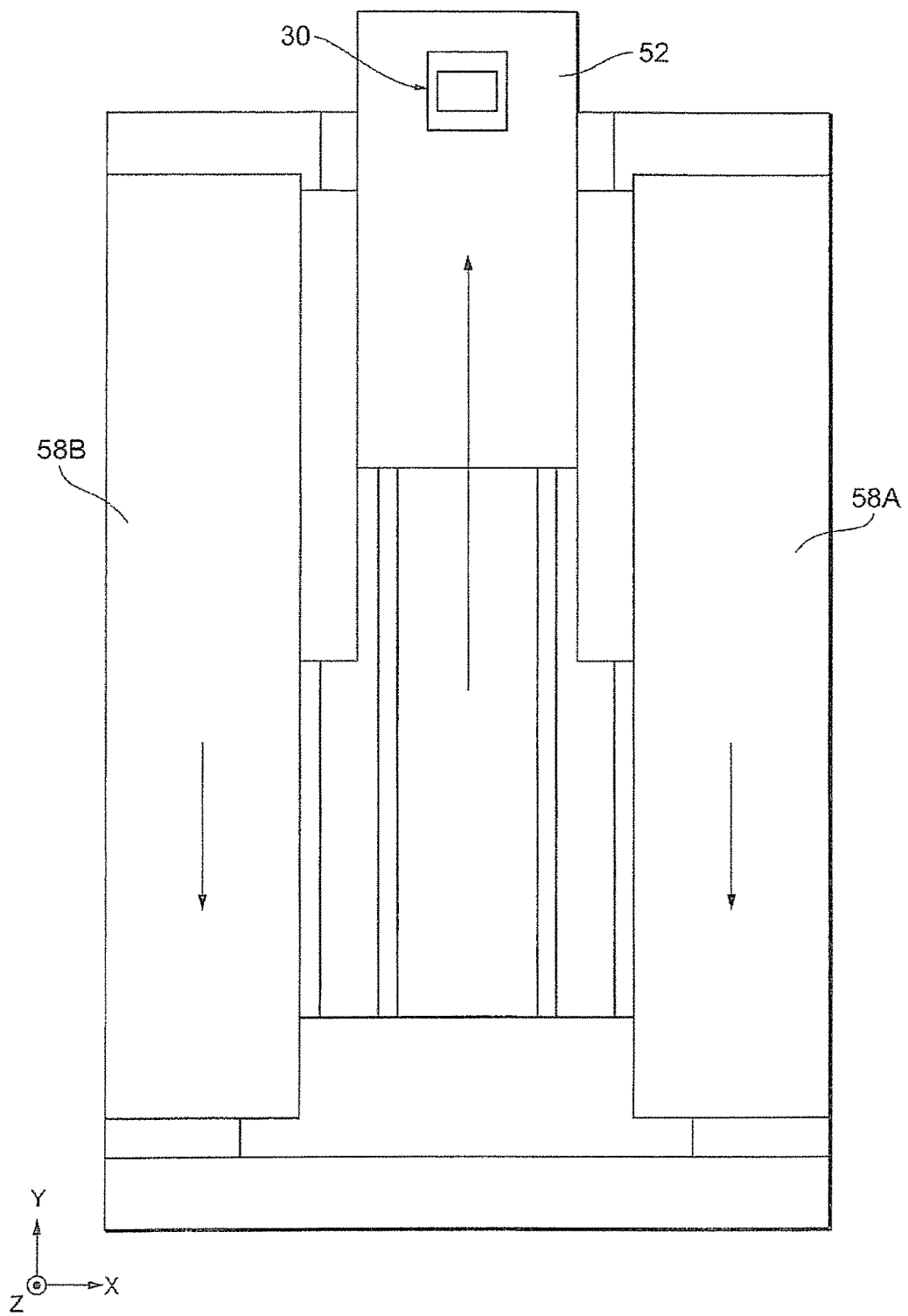
FIG. 6 is a bottom view illustrating a state of a movement in a Y direction of a table.

FIG. 6 is a bottom view for illustrating a state of a movement of the table in the Y axis direction. The first reaction member 58A and the second reaction member 58B move toward a negative direction (minus direction) in the Y axis direction opposite to that of the movement of the table 52 when the table 52 moves toward a positive direction (plus direction) in the Y axis direction as indicated as arrows in FIG. 6. On this occasion, the acceleration in the Y axis direction of the table 52 is equal to or more than 10.0 G, for example, and the table 52 is configured to move at a relatively high acceleration in the Y axis direction. Moreover, a moving distance in the Y axis direction of the table 52 is at most approximately 100 [mm], or can reach at most approximately 200 [mm], for example, depending on the case, and the table 52 is configured to move over a relatively long distance in the Y axis direction.

Figure 7:
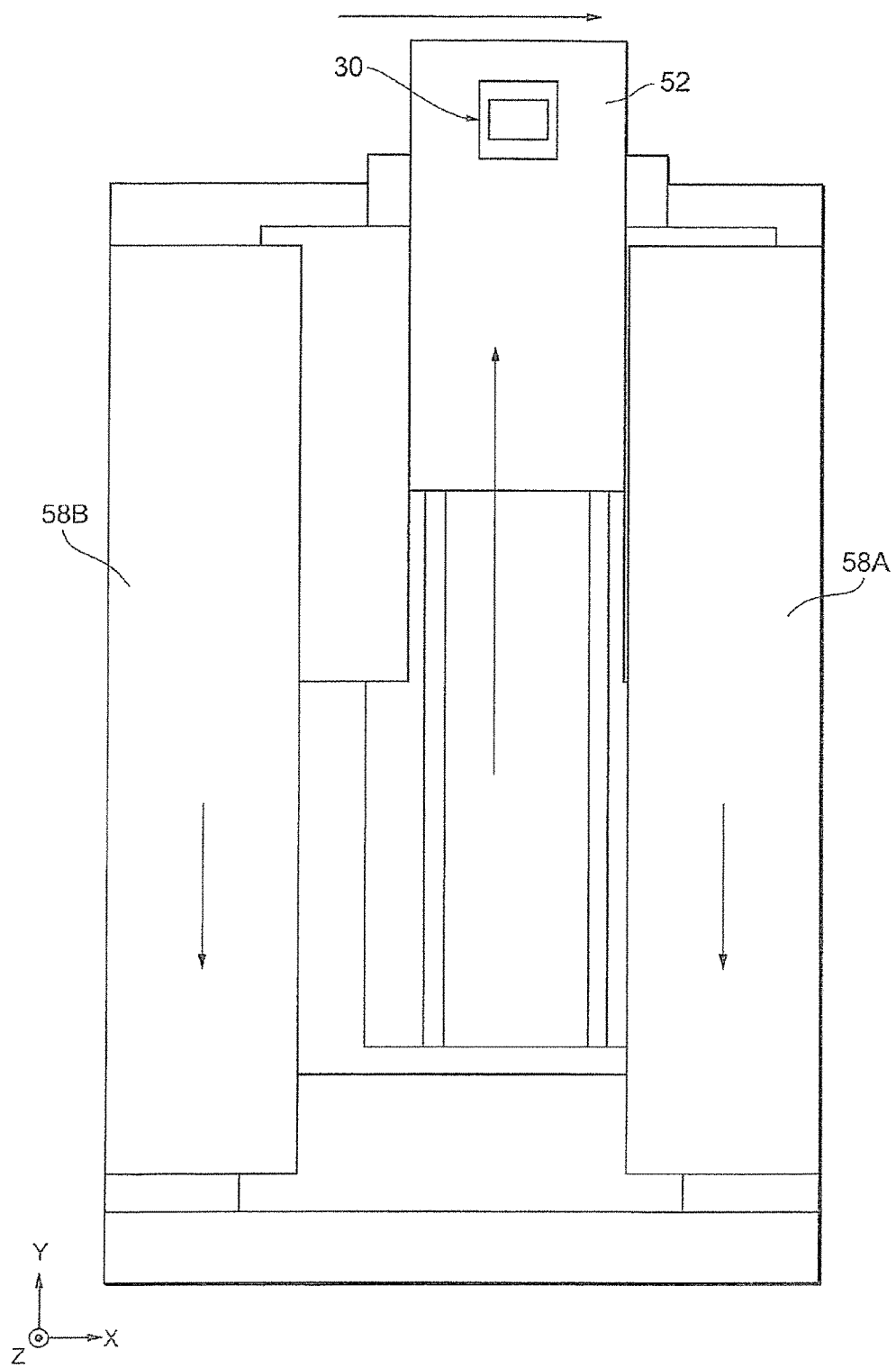
FIG. 7 is a bottom view illustrating a state of a movement in an X direction and the Y direction of the table.
Figure 8:
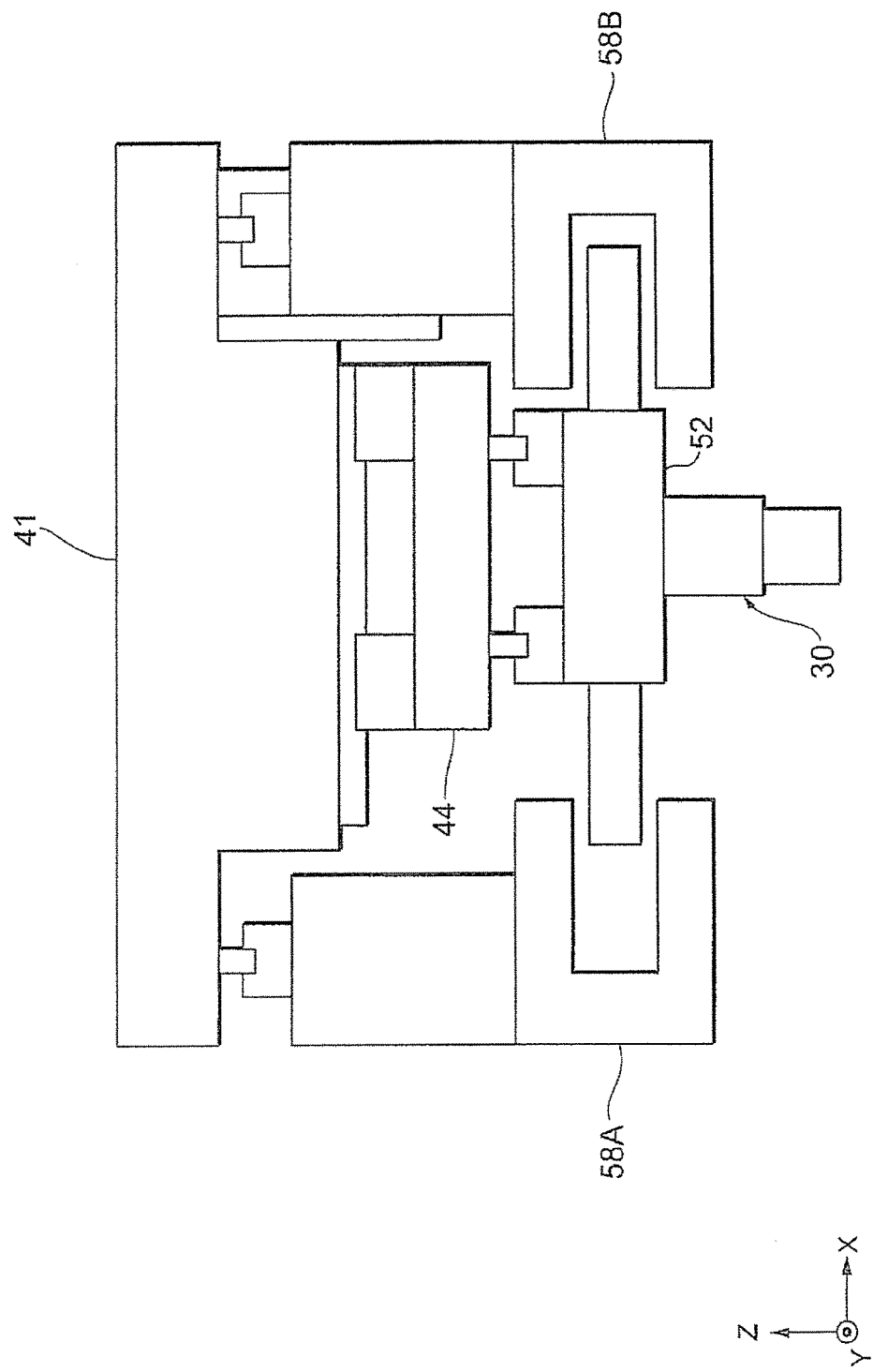
FIG. 8 is a front view illustrating the state of the movement in the X direction and the Y direction of the table.

FIG. 7 is a bottom view for illustrating a state of a movement of the table in the X axis direction and the Y axis direction, and FIG. 8 is a front view showing the state of the movement of the table in the X axis direction and the Y axis direction. The table 52 can move simultaneously in the Y axis direction and the X axis direction. The first reaction member 58A and the second reaction member 58B move toward the negative direction (minus direction) in the Y axis direction as in the case shown in FIG. 6 when the table 52 moves toward the positive direction (plus direction) in the Y axis direction as indicated as arrows in FIG. 7. Simultaneously, the table 52 moves toward the positive direction (plus direction) in the X axis direction as indicated as arrows in FIG. 7 and FIG. 8. On this occasion, the acceleration in the X axis direction of the table 52 is equal to or less than 1.0 G, for example, and the table 52 is thus configured to move at a relatively low acceleration in the X axis direction. Moreover, the moving distance of the table 52 in the X axis direction is, for example, only at most some millimeters, and the table 52 is configured to move over a relatively short distance in the X axis direction.

On this occasion, the table and the reaction member are arranged in the drive direction, namely the Y axis direction, in a conventional drive mechanism for the bonding apparatus. Therefore, a center of gravity of the table and the center of gravity of the reaction member are largely displaced from each other in a stop (stationary) state, and the table and the reaction member move in the directions opposite to each other, and the displacement between the centers of gravity further increases during the movement. As a result, the weight is biased on one side on the pedestal that supports the table and the reaction member, which is an imbalanced state, namely a state bad in a weight balance, and an adverse effect such as generation of a moment on the bonding head provided on the table has thus arisen.

In contrast, the first reaction member 58A and the second reaction member 58B are respectively arranged on both sides of the X axis direction, with the table 52 interposed between, as shown in FIG. 2 in the stop (stationary) state in the XY drive mechanism 40, and the first reaction member 58A and the second reaction member 58B are arranged such that the center of gravity of the first reaction member 58A and the second reaction member 58B is positioned in the X axis direction based on the center of gravity of the table 52 according to this embodiment. Moreover, the first reaction member 58A and the second reaction member 58B are on an XY plane the same or approximately the same as that of the table 52, and are arranged such that the center of gravity of the first reaction member 58A and the second reaction member 58B is positioned in the Z axis direction based on the center of gravity of the table 52. Further, the first reaction member 58A and the second reaction member 58B are arranged such that the center of gravity of the first reaction member 58A and the second reaction member 58B is positioned based on the center of gravity of the table 52 also in the Y axis direction. The first reaction member 58A and the second reaction member 58B are arranged such that the center of gravity of the first reaction member 58A and the second reaction member 58B is positioned based on the center of gravity of the table 52 in this way, thereby enabling a decrease in the displacement between the center of gravity of the table 52 and the center of gravity of the first reaction member 58A and the second reaction member 58B in comparison with the conventional bonding apparatus.

It should be noted that the position of the center of gravity of the first reaction member 58A and the second reaction member 58B preferably coincides with the position of the center of gravity of the table 52 in the X axis direction, the Y axis direction, and the Z axis direction. As a result, the pedestal 41 excellent in the weight balance for the XY drive mechanism 40 can easily be realized (configured).

Moreover, the table 52, the first reaction member 58A, and the second reaction member 58B are preferably arranged such that the center of gravity of the table 52 and the center of gravity of the first reaction member 58A and the second reaction member 58B are positioned based on a center of gravity of the pedestal 41. As a result, the displacement of the center of gravity of the table 52, the center of gravity of the first reaction member 58A and the second reaction member 58B, and the center of gravity of the pedestal 41 can be decreased. Thus, the weight balance of the entire XY drive mechanism 40 including the pedestal 41 can be improved.

Although a description is given about the example that the table 52 moves simultaneously in the Y axis direction and the X axis direction in FIG. 7 and FIG. 8 according to this embodiment, the configuration is not limited to this example. For example, the table 52 can be moved in the Y axis direction, and the table 52 can then be moved in the X axis direction, or, conversely, the table 52 can be moved in the X axis direction, and the table 52 can then be moved in the Y axis direction.

The first reaction member 58A and the second reaction member 58B are configured to move toward the direction opposite to that of the table 52 in the Y axis direction when the table 52 moves in the Y axis direction in this way according to this embodiment. As a result, the momentum applied to the pedestal 41 becomes theoretically zero, and the pedestal 41 can thus be prevented from swinging. Moreover, the first reaction member 58A and the second reaction member 58B are respectively arranged on the both sides of the X axis direction, with the table 52 interposed between. As a result, the first reaction member 58A and the second reaction member 58B can be arranged in the compact manner without an extension in the Y direction. Thus, the increase in the space for the first reaction member 58A and the second reaction member 58B can be suppressed. Further, the first reaction member 58A and the second reaction member 58B are arranged such that the center of gravity of the first reaction member 58A and the second reaction member 58B is positioned based on the center of gravity of the table 52. As a result, the displacement between the center of gravity of the table 52 and the center of gravity of the first reaction member 58A and the second reaction member 58B can be decreased in comparison with the conventional bonding apparatus. Thus, the weight balance in the pedestal 41 can be improved, and, for example, an adverse effect such as the generation of a moment on the bonding head 31 provided on the table 52 can be decreased.

It should be noted that the disclosure is not limited to the embodiment, and can be modified in various ways for application.

Moreover, the examples and application examples described in the embodiment of the disclosure can be appropriately combined, modified, or improved for use depending on applications, and the disclosure is not limited to the description of the embodiment. It will be apparent from the description of the claims that such the combinations, or such modified or improved forms can also be included within the technical scope of the disclosure.

The invention claimed is:

1. A bonding apparatus, comprising:
a table that is provided movably in a first direction with respect to a pedestal;
a first reaction member and a second reaction member that are respectively provided movably in the first direction with respect to the pedestal; and
a first direction driving unit that includes a coil and a magnet and respectively drives the table, the first reaction member and the second reaction member in the first direction, wherein:
the first reaction member and the second reaction member are each configured to move in a direction opposite to the table in the first direction when the table moves in the first direction;
the first reaction member and the second reaction member are respectively located at two sides of the table and supported by the pedestal at two sides in the second direction that is perpendicular to the first direction; and
the first reaction member and the second reaction member are arranged such that a center of gravity of the first reaction member and the second reaction member is at a position based on a center of gravity of the table,
the coil is provided on the table,
the magnet is provided on the first reaction member and the second reaction member, and
the table is provided movably in the second direction with respect to the pedestal and supported by the pedestal.

2. The bonding apparatus according to claim 1, wherein: the table, the first reaction member, and the second reaction member are respectively arranged such that the center of gravity of the table and the center of gravity of the first reaction member and the second reaction member are at positions based on a center of gravity of the pedestal.

3. The bonding apparatus according to claim 2, wherein: a position of the center of gravity of the first reaction member and the second reaction member coincides with a position of the center of gravity of the table in the first direction, the second direction, and a third direction perpendicular to the first direction and the second direction.

4. The bonding apparatus according to claim 1, wherein: a position of the center of gravity of the first reaction member and the second reaction member coincides with a position of the center of gravity of the table in the first direction, the second direction, and a third direction perpendicular to the first direction and the second direction.

5. The bonding apparatus according to claim 1, wherein: the table is configured to move over a relatively long distance in the first direction, and to move over a relatively short distance in the second direction.

6. The bonding apparatus according to claim 5, wherein: the table is configured to move at a relatively high rate of acceleration in the first direction, and to move at a relatively low rate of acceleration in the second direction.

7. The bonding apparatus according to claim 1, wherein: the table is configured to move at a relatively high rate of acceleration in the first direction, and to move at a relatively low rate of acceleration in the second direction.

8. The bonding apparatus according to claim 1, wherein: a bonding head used for bonding is provided on the table.

* * * * *